United States Patent
Chakraborty

(10) Patent No.: US 8,637,883 B2
(45) Date of Patent: Jan. 28, 2014

(54) LOW INDEX SPACER LAYER IN LED DEVICES

(75) Inventor: Arpan Chakraborty, Goleta, CA (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 12/077,638

(22) Filed: Mar. 19, 2008

(65) Prior Publication Data

US 2009/0236621 A1  Sep. 24, 2009

(51) Int. Cl.
*H01L 33/00* (2010.01)

(52) U.S. Cl.
USPC ........ 257/98; 257/99; 257/100; 257/E33.056; 438/26; 438/29

(58) Field of Classification Search
USPC .......... 438/29, 25, 26, 27, 39; 257/79, 98, 99, 257/100, E33.056, E33.057, E33.058, 257/E33.059, E25.032
See application file for complete search history.

(56) References Cited

U.S. PATENT DOCUMENTS

| | | | |
|---|---|---|---|
| 4,476,620 A | 10/1984 | Ohki et al. | 438/33 |
| 4,733,335 A | 3/1988 | Serizawa et al. | 362/503 |
| 4,918,497 A | 4/1990 | Edmond | 357/17 |
| 4,935,665 A | 6/1990 | Murata | 313/500 |
| 4,946,547 A | 8/1990 | Palmour et al. | 156/643 |
| 4,966,862 A | 10/1990 | Edmond | 437/100 |
| 5,027,168 A | 6/1991 | Edmond | 357/17 |

(Continued)

FOREIGN PATENT DOCUMENTS

| | | |
|---|---|---|
| DE | 102005062514 | 3/2007 |
| EP | 0732740 A2 | 9/1996 |

(Continued)

OTHER PUBLICATIONS

"High Refractive Index Thin Films of Epoxy Resin compounded with TiO2 Nanoparticles" by Lin et al.; Polymeric Materials: Science and Engineering; 234th ACS National Meeting, Boston, MA; Aug. 19-23, 2007).*

(Continued)

*Primary Examiner* — A. Sefer
*Assistant Examiner* — Farid Khan
(74) *Attorney, Agent, or Firm* — Koppel, Patrick, Heybl & Philpott

(57) ABSTRACT

A light emitting diode (LED) device having a low index of refraction spacer layer separating the LED chip and a functional layer. The LED chip has a textured light emission surface to increase light extraction from the chip. The spacer layer has an index of refraction that is lower than both the LED chip and the functional layer. Most of the light generated in the LED chip passes easily into the spacer layer due to the textured surface of the chip. At the interface of the spacer layer and the functional layer the light sees a step-up in index of refraction which facilitates transmission. A portion of the light that has passed into the functional layer will be reflected or scattered back toward the spacer layer where some of it will experience total internal reflection. Total internal reflection at this interface may increase extraction efficiency by reducing the amount of light that re-enters the spacer layer and, ultimately, the LED chip where it may be absorbed. The spacer layer also provides a thermal buffer between the LED chip and the functional layer. Thus, the functional layer, which may be a wavelength conversion layer comprising phosphors, for example, is insulated from direct thermal transfer from the LED chip. The spacer layer can also function as a passivation layer.

38 Claims, 2 Drawing Sheets

(56) References Cited

U.S. PATENT DOCUMENTS

| | | | | |
|---|---|---|---|---|
| 5,200,022 | A | 4/1993 | Kong et al. | 156/612 |
| 5,210,051 | A | 5/1993 | Carter, Jr. | 437/107 |
| 5,277,840 | A | 1/1994 | Osaka et al. | 252/301.36 |
| 5,338,944 | A | 8/1994 | Edmond et al. | 257/76 |
| RE34,861 | E | 2/1995 | Davis et al. | 437/100 |
| 5,393,993 | A | 2/1995 | Edmond et al. | 257/77 |
| 5,416,342 | A | 5/1995 | Edmond et al. | 257/76 |
| 5,523,589 | A | 6/1996 | Edmond et al. | 257/77 |
| 5,604,135 | A | 2/1997 | Edmond et al. | 437/22 |
| 5,614,131 | A | 3/1997 | Mukerji et al. | 264/1.9 |
| 5,631,190 | A | 5/1997 | Negley | 438/33 |
| 5,739,554 | A | 4/1998 | Edmond et al. | 257/103 |
| 5,766,987 | A | 6/1998 | Mitchell et al. | 438/126 |
| 5,813,753 | A * | 9/1998 | Vriens et al. | 362/293 |
| 5,858,278 | A | 1/1999 | Itoh et al. | 252/301.4 R |
| 5,912,477 | A | 6/1999 | Negley | 257/95 |
| 5,923,053 | A | 7/1999 | Jakowetz et al. | 257/95 |
| 5,959,316 | A | 9/1999 | Lowery | 257/98 |
| 5,998,925 | A | 12/1999 | Shimizu | 313/503 |
| 6,001,671 | A | 12/1999 | Fjelstad | 438/112 |
| 6,066,861 | A | 5/2000 | Horn et al. | 257/99 |
| 6,069,440 | A | 5/2000 | Shimizu et al. | 313/486 |
| 6,087,202 | A | 7/2000 | Exposito et al. | 438/113 |
| 6,120,600 | A | 9/2000 | Edmond et al. | 117/89 |
| 6,132,072 | A | 10/2000 | Turnbull et al. | 362/494 |
| 6,139,304 | A | 10/2000 | Centofante | 425/121 |
| 6,153,448 | A | 11/2000 | Takahashi | 438/114 |
| 6,187,606 | B1 | 2/2001 | Edmond et al. | 438/46 |
| 6,201,262 | B1 | 3/2001 | Edmond et al. | 257/77 |
| 6,245,259 | B1 | 6/2001 | Hohn et al. | 252/301.36 |
| 6,252,254 | B1 | 6/2001 | Soules et al. | 257/98 |
| 6,329,224 | B1 | 12/2001 | Nguyen et al. | 438/127 |
| 6,331,063 | B1 | 12/2001 | Kamada et al. | 362/237 |
| 6,338,813 | B1 | 1/2002 | Hsu et al. | 264/272.14 |
| 6,376,277 | B2 | 4/2002 | Corisis | 438/106 |
| 6,404,125 | B1 | 6/2002 | Garbuzov | 313/499 |
| 6,501,100 | B1 | 12/2002 | Srivastava | |
| 6,531,328 | B1 | 3/2003 | Chen | 438/26 |
| 6,583,444 | B2 | 6/2003 | Fjelstad | 257/82 |
| 6,614,103 | B1 | 9/2003 | Durocher et al. | 257/678 |
| 6,624,058 | B1 | 9/2003 | Kazama | 438/612 |
| 6,642,652 | B2 | 11/2003 | Collins, III | 313/512 |
| 6,653,765 | B1 | 11/2003 | Levinson | 313/112 |
| 6,733,711 | B2 | 5/2004 | Durocher et al. | 264/272.14 |
| 6,759,266 | B1 | 7/2004 | Hoffman | 438/64 |
| 6,791,119 | B2 | 9/2004 | Slater, Jr. et al. | 257/99 |
| 6,791,259 | B1 | 9/2004 | Stokes | |
| 6,793,371 | B2 | 9/2004 | Lamke et al. | 362/241 |
| 6,812,500 | B2 | 11/2004 | Reeh et al. | 257/98 |
| 6,853,010 | B2 | 2/2005 | Slater, Jr. et al. | 257/98 |
| 6,860,621 | B2 | 3/2005 | Bachl et al. | 362/373 |
| 6,884,647 | B2 | 4/2005 | Sakai et al. | 438/30 |
| 6,891,200 | B2 | 5/2005 | Nagai et al. | 257/88 |
| 6,919,683 | B1 | 7/2005 | Jang | 313/503 |
| 6,921,929 | B2 | 7/2005 | LeBoeuf et al. | 257/100 |
| 6,939,481 | B2 | 9/2005 | Srivastava | |
| 6,958,497 | B2 | 10/2005 | Emerson et al. | 257/94 |
| 6,972,438 | B2 | 12/2005 | Li et al. | 257/98 |
| 7,023,019 | B2 | 4/2006 | Maeda et al. | 257/89 |
| 7,029,935 | B2 | 4/2006 | Negley et al. | |
| 7,049,159 | B2 | 5/2006 | Lowery | 438/22 |
| 7,183,587 | B2 | 2/2007 | Negley et al. | 257/99 |
| 7,202,598 | B2 | 4/2007 | Juestel et al. | 313/503 |
| 7,286,296 | B2 | 10/2007 | Chaves et al. | 359/641 |
| 7,601,550 | B2 | 10/2009 | Bogner | |
| 7,858,999 | B2 * | 12/2010 | Horng et al. | 257/98 |
| 7,868,341 | B2 * | 1/2011 | Diana et al. | 257/98 |
| 2002/0001869 | A1 | 1/2002 | Fjelstad | |
| 2002/0006040 | A1 | 1/2002 | Kamada et al. | |
| 2002/0056847 | A1 | 5/2002 | Uemura et al. | |
| 2002/0057057 | A1 | 5/2002 | Sorg | |
| 2002/0070449 | A1 | 6/2002 | Yagi et al. | |
| 2002/0079837 | A1 | 6/2002 | Okazaki | |
| 2002/0096789 | A1 | 7/2002 | Bolken | |
| 2002/0105266 | A1 | 8/2002 | Juestel et al. | |
| 2002/0123164 | A1 | 9/2002 | Slater, Jr. et al. | |
| 2002/0185965 | A1 | 12/2002 | Collins, III et al. | |
| 2002/0195935 | A1 | 12/2002 | Jager et al. | |
| 2003/0006418 | A1 | 1/2003 | Emerson et al. | |
| 2003/0038596 | A1 * | 2/2003 | Ho | 313/512 |
| 2003/0066311 | A1 | 4/2003 | Li et al. | |
| 2003/0121511 | A1 | 7/2003 | Hashimura et al. | |
| 2003/0160258 | A1 | 8/2003 | Oohata | |
| 2003/0207500 | A1 | 11/2003 | Pichler et al. | |
| 2004/0004435 | A1 | 1/2004 | Hsu | |
| 2004/0012958 | A1 | 1/2004 | Hashimoto | |
| 2004/0037949 | A1 | 2/2004 | Wright | |
| 2004/0038442 | A1 | 2/2004 | Kinsman | |
| 2004/0041159 | A1 | 3/2004 | Yuri et al. | |
| 2004/0041222 | A1 | 3/2004 | Loh | |
| 2004/0056260 | A1 | 3/2004 | Slater, Jr. et al. | |
| 2004/0070004 | A1 | 4/2004 | Eliashevich et al. | |
| 2004/0080939 | A1 | 4/2004 | Braddell et al. | |
| 2004/0104391 | A1 * | 6/2004 | Maeda et al. | 257/79 |
| 2004/0106234 | A1 | 6/2004 | Sorg et al. | |
| 2004/0164307 | A1 | 8/2004 | Mueller-Mach et al. | |
| 2004/0188697 | A1 | 9/2004 | Brunner et al. | |
| 2005/0002168 | A1 | 1/2005 | Narhi et al. | |
| 2005/0006651 | A1 | 1/2005 | LeBoeuf et al. | |
| 2005/0051782 | A1 | 3/2005 | Negley et al. | |
| 2005/0072981 | A1 | 4/2005 | Suenaga | |
| 2005/0082562 | A1 | 4/2005 | Ou et al. | |
| 2005/0093004 | A1 | 5/2005 | Yoo | |
| 2005/0122031 | A1 | 6/2005 | Itai | |
| 2005/0184305 | A1 | 8/2005 | Ueda | |
| 2005/0196886 | A1 | 9/2005 | Jager et al. | |
| 2005/0211991 | A1 | 9/2005 | Mori et al. | |
| 2005/0221519 | A1 | 10/2005 | Leung et al. | |
| 2005/0253151 | A1 | 11/2005 | Sakai et al. | |
| 2005/0265404 | A1 | 12/2005 | Ashdown | |
| 2005/0280894 | A1 | 12/2005 | Hartkop et al. | |
| 2006/0001046 | A1 | 1/2006 | Batres et al. | |
| 2006/0012299 | A1 * | 1/2006 | Suehiro et al. | 313/512 |
| 2006/0061259 | A1 * | 3/2006 | Negley | 313/499 |
| 2006/0091788 | A1 | 5/2006 | Yan | |
| 2006/0157721 | A1 | 7/2006 | Tran et al. | |
| 2006/0163589 | A1 | 7/2006 | Fan et al. | |
| 2006/0261292 | A1 | 11/2006 | Kim et al. | |
| 2007/0001182 | A1 | 1/2007 | Schardt et al. | |
| 2007/0012940 | A1 * | 1/2007 | Suh et al. | 257/99 |
| 2007/0023763 | A1 * | 2/2007 | Takigawa et al. | 257/79 |
| 2007/0029569 | A1 | 2/2007 | Andrews | |
| 2007/0096113 | A1 | 5/2007 | Inoshita et al. | |
| 2007/0096131 | A1 | 5/2007 | Chandra | |
| 2007/0097501 | A1 * | 5/2007 | Stern et al. | 359/453 |
| 2007/0158668 | A1 | 7/2007 | Tarsa et al. | |
| 2007/0158669 | A1 | 7/2007 | Lee et al. | |
| 2007/0165403 | A1 | 7/2007 | Park | |
| 2008/0006815 | A1 | 1/2008 | Wang et al. | |
| 2008/0173884 | A1 | 7/2008 | Chitnis et al. | |
| 2008/0179609 | A1 * | 7/2008 | Trottier et al. | 257/98 |
| 2008/0203410 | A1 | 8/2008 | Brunner et al. | |
| 2008/0211386 | A1 * | 9/2008 | Choi et al. | 313/503 |
| 2008/0217579 | A1 * | 9/2008 | Ishida et al. | 252/301.4 R |
| 2009/0121241 | A1 * | 5/2009 | Keller et al. | 257/96 |
| 2009/0261366 | A1 * | 10/2009 | Eisert et al. | 257/98 |
| 2010/0283074 | A1 * | 11/2010 | Kelley et al. | 257/98 |

FOREIGN PATENT DOCUMENTS

| | | |
|---|---|---|
| EP | 1059678 | 12/2000 |
| EP | 1138747 | 10/2001 |
| EP | 1198016 A2 | 4/2002 |
| EP | 1367655 | 12/2003 |
| EP | 1385215 A2 | 1/2004 |
| EP | 1724848 A | 11/2006 |
| EP | 1724848 A2 | 11/2006 |
| FR | 2704690 | 11/1994 |
| FR | 2704690 A | 11/1994 |
| JP | 2000002802 | 1/2000 |
| JP | 2000208820 A | 7/2000 |
| JP | 2002009097 A | 1/2002 |
| JP | 2002-50799 A | 2/2002 |
| JP | 2002-050799 A | 2/2002 |

(56) References Cited

FOREIGN PATENT DOCUMENTS

| | | |
|---|---|---|
| JP | 2002-076446 | 3/2002 |
| JP | 2002-531955 | 9/2002 |
| JP | 2002-531956 | 9/2002 |
| JP | 2003069086 | 3/2003 |
| JP | 2003-526212 | 9/2003 |
| JP | 2003532298 A | 10/2003 |
| JP | 2003-318448 | 11/2003 |
| JP | 2003-533852 | 11/2003 |
| JP | 2004-501512 | 1/2004 |
| JP | 2005244226 | 9/2005 |
| JP | 2005298817 | 10/2005 |
| JP | 2006054209 | 2/2006 |
| JP | 2006324672 A | 11/2006 |
| JP | 2007053358 A | 3/2007 |
| JP | 2007067420 | 3/2007 |
| JP | 2007116131 | 5/2007 |
| JP | 2007116131 A | 5/2007 |
| JP | 2007258701 | 10/2007 |
| JP | 2010521060 | 6/2010 |
| WO | WO 00/33390 | 6/2000 |
| WO | WO0124283 A | 4/2001 |
| WO | WO0124283 A1 | 4/2001 |
| WO | WO 03/021668 A1 | 3/2003 |
| WO | WO03021691 A1 | 3/2003 |
| WO | WO2005101909 | 10/2005 |
| WO | WO2006033695 A2 | 3/2006 |
| WO | WO2006036251 A1 | 4/2006 |
| WO | PCT/DE2006/001701 * | 9/2006 |
| WO | WO2007018560 | 2/2007 |
| WO | WO2008003176 A1 | 1/2008 |

OTHER PUBLICATIONS

Official Notice of Rejection re related Japanese Patent Application No. 2007-533459, Dated: Jul. 29, 2008.
Patent Abstracts of Japan, Pub. No. 2001-181613, Date: Jul. 3, 2001.
Patent Abstracts of Japan, Pub. No. 11-040858, Date: Feb. 12, 1999.
Patent Abstracts of Japan, Pub. No. 2004-221185, Date: Aug. 5, 2004.
International Search Report for PCT/US2007/024367, Dated: Oct. 22, 2008.
PCT International Preliminary Report, PCT/US05/20603, Mar. 2008.
Official Notice of Rejection Mailed Jul. 29, 2008, Japanese Patent Application No. 2007-533459.
Patent Abstracts of Japan 2004-221185 Aug. 5, 2004.
Patent Abstracts of Japan 11-040858, Feb. 12, 1999.
Patent Abstract of Japan 2001-181613, Jul. 3, 2001.
Official Notice of Final Decision of Rejection re: related Japanese Patent Application No. 2007-533459, dated: Dec. 26, 2008.
Rejection Decision re: related Chinese Patent Application No. 200580031382.3, dated: Feb. 2, 2009.
Communication pursuant to Article 94(3) EPC re: related European Application No. 05808825.3, dated: Feb. 18, 2009.
PCT International Search Report and Written Opinion, PCT/US2007/024366, Date: Jul. 15, 2008.
Japanese Publication No. JP2005033138(A), Date: Feb. 3, 2005 to Shoji Iwao; Fujisawa Shigeo.
Examination of related European Application No. 05 808 825.3-2203, Dated: Mar. 18, 2009.
International Search Report and Written Opinion from related PCT Application No. PCT/US2009/001572, dated: Jul. 17, 2009.
From related application. Japanese Patent Application No. 2006-526964, Official Notice of Rejection, mailed Feb. 16, 2010.
Patent Abstracts of Japan, Publication No. 2003-258011 dated Sep. 12, 2003.
Patent Abstracts of Japan, Publication No. 2002-093830 dated Mar. 29, 2002.
Office Action from related U.S. Appl. No. 11/982,276, dated Dec. 7, 2009.
Notice on Reexamination for Chinese Patent Application No. 200580031382.3 mailed May 28, 2010.
Patent Abstracts of Japan No. 2002-050799 dated Feb. 15, 2002 to Stanley Electric Co. Ltd.
Office Action from Japanese Patent Application No. 2007-533459 (Appeal No. 2009-006588) mailed Jul. 16, 2010.
Office Action from Chinese Patent Application No. 200780012387.0 mailed Jun. 30, 2010.
Summons for Oral Proceedings from European Patent Application No. 05808825.3 dated Sep. 9, 2010.
Notification of the First Office Action for Chinese Patent Application No. 200780050127.2 mailed Aug. 8, 2010.
Notice of Rejection for Japanese Patent Application No. 2006-526964 issued Oct. 5, 2010.
Notification of the First Office Action for Chinese Patent Application No. 200780050197.8 dated Sep. 9, 2010.
Rexamination Decision No. 27346 for Chinese Patent Application No. 200580031382.3 dated Oct. 27, 2010.
Summary of Notice of Reasons for Rejection from Japanese Patent Application No. 2011-500788, dated May 29. 2012.
First Office Action for Chinese Patent Application No. 200980118291.1, dated Apr. 5. 2012.
Notice of Reasons for Rejection from Japanese Patent Application No. 2011-500788, dated Dec. 11, 2012.
Office Action from U.S. Appl. No. 11/656,759, dated: Nov. 25, 2009.
Response to Office Action from U.S. Appl. No. 11/656,759, filed: Apr. 26, 2010.
Office Action from U.S. Appl. No. 11/398,214, dated: Dec. 11, 2009.
Response to Office Action from U.S. Appl. No. 11/398,214, filed: Mar. 2, 2010.
Office Action from U.S. Appl. No. 10/666,399, dated: Dec. 22, 2009.
Response to Office Action from U.S. Appl. No. 10/666,399, filed: Mar. 22, 2010.
Office Action from U.S. Appl. No. 12/008,477, dated: Mar. 1, 2010.
Response to Office Action from U.S. Appl. No. 12/008,477, filed: May 26, 2010.
Office Action from U.S. Appl. No. 11/982,276, dated: Mar. 25, 2010.
Response to Office Action from U.S. Appl. No. 11/982,276, filed: Jun. 21, 2010
Office Action from U.S. Appl. No. 10/666,399, dated: May 11, 2010.
Response to Office Action from U.S. Appl. No. 10/666,399, filed: Aug. 11, 2010.
Office Action from U.S. Appl. No. 11/881,683, dated: May 12, 2010.
Response to Office Action from U.S. Appl. No. 11/881,683, filed: Aug. 3, 2010.
Office Action from U.S. Appl. No. 11/595,720, dated: May 14, 2010.
Response to Office Action from U.S. Appl. No. 11/595,720, filed: Jul. 7, 2010.
Office Action from U.S. Appl. No. 11/656,759, dated: May 21, 2010.
Office Action from U.S. Appl. No. 11/899,790, dated: Jun. 2, 2010.
Office Action from U.S. Appl. No. 12/506,989, dated: Jul. 23, 2010.
Office Action from U.S. Appl. No. 11/982,276, dated Aug. 19, 2010.
Office Action from U.S. Appl. No. 12/008,477, dated: Oct. 7, 2010.
Office Action from U.S. Appl. No. 11/827,626, dated: Oct. 7, 2010.
Office Action from U.S. Appl. No. 11/881,683, dated: Oct. 14, 2010.
Notice of Allowance from U.S. Appl. No. 10/666,399, dated: Oct. 14, 2010.
Office Action re related U.S. Appl. No. 10/666,399, dated: Sep. 5, 2008.
Decision of Rejection from Chinese Patent Application No. 200980118291.1, dated Mar. 6, 2013.
Decision on Rejection from Chinese Patent Application No. 200980118291.1, dated Jan. 11, 2013.
Related Indian Patent Application No. 4867/DELNP/2005, first examination report dated: Apr. 4, 2008.
NPO-30394 Electrophoretic Deposition for Fabricating Microbatteries p. 1-2, NASA Tech Briefs Issue May 3, 2003.
U.S. Appl. No. 11/656,759, filed Jan. 22, 2007, Wafer Level Phosphor Coating Method and Devices Fabricated Utilizing Method.
U.S. Appl. No. 11/899,790, filed Sep. 7, 2007, Wafer Level Phosphor Coating Method and Devices Fabricated Utilizing Method.
U.S. Appl. No. 11/473,089, filed Jun. 21, 2006, Close Loop Electrophoretic Deposition of Semiconductor Devices.
Nichia Corp. White LED Part No. NSPW300BS, Specification for Nichia White LED, Model NSPW300BS Jan. 14, 2004.

(56) References Cited

OTHER PUBLICATIONS

Nichia Corp. White LED Part No. NSPW312BS, Specification for Nichia White LED, Model NSPW312BS Jan. 14, 2004.
Lau, John, "Flip-Chip Technologies", McGraw Hill, 1996, pp.
International Materials Reviews "Materials for Field Emission Displays", A.P. Burden 2001.
Decision of Rejection and Decision of Dismissal of Amendment, dated Jul. 2, 2013.

* cited by examiner

*FIG. A*
PRIOR ART

LOW INDEX SPACER LAYER IN LED DEVICES

BACKGROUND OF THE INVENTION

1. Field of the Invention

The present invention relates to LED devices and, more specifically, to LED devices with low index spacer layers and methods of manufacturing such devices.

2. Description of the Related Art

Solid state light emitting devices, such as inorganic or organic light emitting diodes (LEDs), convert energy to light and are widely used for many applications. As known to those having skill in the art, inorganic solid state devices generally include one or more active regions of semiconductor material interposed between oppositely doped regions. When a bias is applied across the doped regions, electron-hole recombination events occur to generate light, and light is emitted from the active region in omnidirectional paths from all surfaces of the LED. Conventional LEDs may incorporate reflectors and/or mirror surfaces to direct the emitted light in a desired direction.

The color or wavelength emitted by an LED is largely dependent on the properties of the material from which it is generated, such as the bandgap of the active region. LEDs have been built to emit light in a range of colors in the visible spectrum including red, yellow, green, and blue. Other LEDs emit in the ultraviolet (UV) range of the electromagnetic spectrum. It is often desirable to incorporate phosphors into a LED to tailor the emission spectrum by converting a portion of the light from the LED before it is emitted. For example, in some blue LEDs a portion of the blue light is "downconverted" to yellow light. Thus, the LED emits a combination of blue and yellow light to generate a spectrum that appears white to the human eye. As used herein, the term "phosphor" is used generically to indicate any photoluminescent material.

Phosphors have been disposed in various regions within the LED structure. For example, phosphor may be dispersed inside and/or coated outside a dome-shaped encapsulant that covers the device. The phosphor may be located remotely from the light emitting die as shown in U.S. Pat. No. 7,286,926. The phosphor may also be coated or deposited on the die itself. Several techniques are frequently used to introduce the phosphor, including electrophoretic deposition, stencil printing, spin or spray coating, etc. Another technique uses a phosphor dispense process where a drop of material, such as epoxy, silicone encapsulant, etc., that contains phosphor therein, may be placed on the die and cured to form a shell over the die. This is sometimes is sometimes referred to as a "glob top" process. In another technique, the drop of material that contains phosphor may be placed on the die and allowed to settle. This technique may be referred to as "remote settling".

Many applications require an LED that emits white light. As used herein, the term "white light" is used in a general sense and includes light that different individuals or detectors may perceive as having a slight tint toward, for example, yellow or blue. As discussed above, some conventional LED devices combine a yellow phosphor on a blue LED to achieve white light. Some of the blue light emitted from the LED passes through the phosphor without being converted, and some of the emitted blue light is downconverted to yellow. The combinations of blue light and yellow light that escape the light emitting device provide a white light output.

LEDs have been manufactured that include several other functional features, such as reflective/refractive layers, lenses and light scattering elements, for example. Some LEDs include surfaces that have been textured to enhance light extraction by reducing total internal reflection at various material interfaces. Many other functional features known in the art may be combined to build an LED having particular characteristics.

FIG. A shows a known LED device 10. An LED chip 11 is disposed on a mount surface 12. A layer of wavelength conversion material 13 surrounds the LED chip 11. An encapsulant 14 covers the LED chip 11 and the conversion layer 13. The LED chip has a textured emission surface 15 that helps to extract light at the interface of the LED chip 11 and the conversion layer 13 by countering the effects of the stepdown in index of refraction. Some of the light emitted from the LED chip 11 is reflected or backscattered inside the conversion layer 13, at the interface with encapsulant 14, or within the encapsulant 14 back towards the textured surface 15. Due to the textured surface 15 coupled with a step-up in index of refraction at the interface, a substantial portion of this incident light re-enters the LED chip 11 where it may be absorbed, decreasing the light extraction efficiency of the device 10.

SUMMARY OF THE INVENTION

One embodiment of an LED device according to the present invention comprises the following elements. An LED chip is disposed on a mount surface. The LED chip has a textured light emission surface and a first index of refraction. A spacer layer is disposed on the LED chip and covers the light emission surface. The spacer layer has a second index of refraction that is smaller than the first index of refraction. At least one functional layer is disposed on the spacer layer.

Another embodiment of an LED device comprises the following elements. An LED chip is disposed on a mount surface and has a textured light emission surface and a first index of refraction. The LED chip emits blue light. A spacer layer is disposed on the LED chip and covers the light emission surface. The spacer layer has a planar surface opposite the LED chip and a second index of refraction that is smaller than the first index of refraction. A wavelength conversion layer is disposed on the spacer layer. The wavelength conversion layer converts a portion of the blue light and emits yellow light. An encapsulant is disposed on the mount surface and covers the LED chip. The LED device is constructed to emit a combination of blue and yellow light such that the combination appears white.

One method of fabricating an LED device comprises the following steps. An LED chip is provided having a first index of refraction and a textured light emission surface. A spacer layer with a second index of refraction on is disposed the LED chip, wherein the second index of refraction is smaller than the first index of refraction. A functional layer with a third index of refraction is disposed on the spacer layer, wherein the second index of refraction is smaller than the third index of refraction, and the second index of refraction is chosen to maximize light extraction efficiency.

BRIEF DESCRIPTION OF THE DRAWINGS

FIG. A is a cross-sectional view of an LED device known in the art.

DETAILED DESCRIPTION OF THE INVENTION

Figure 1:
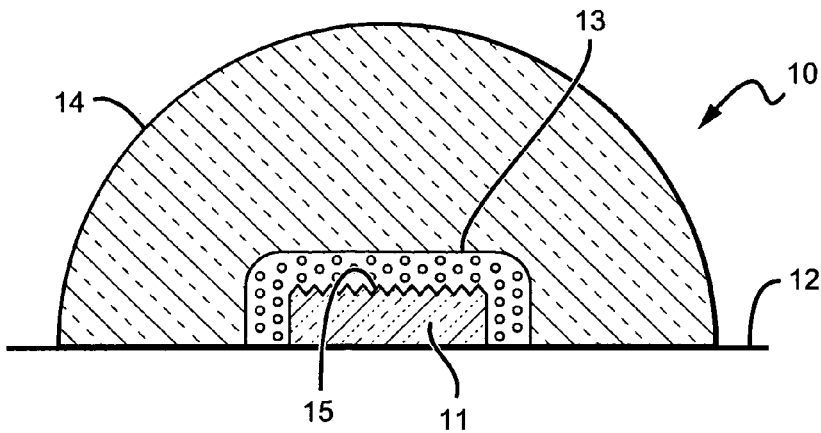
FIG. 1 is a cross-sectional view of an embodiment of an LED device according to the present invention.
Figure 1:
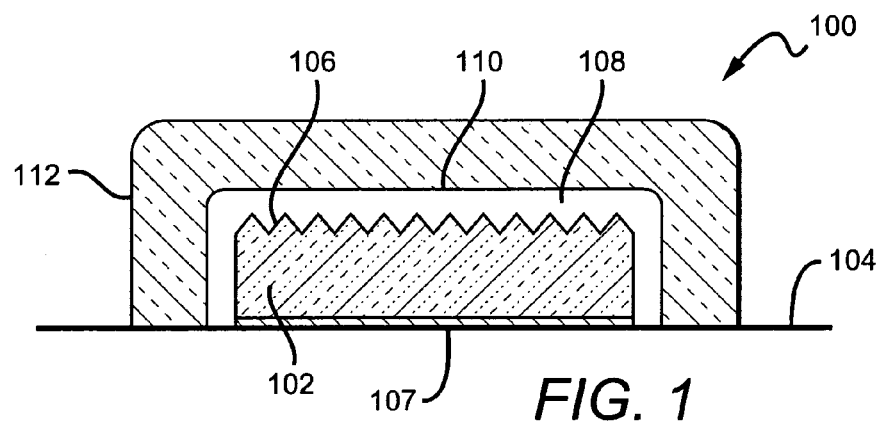

Embodiments of the present invention provide an improved light emitting device wherein the light extraction efficiency is improved by the introduction of a thin spacer layer that is disposed between a textured LED chip and a functional layer. The spacer layer has a lower index of refraction or refractive index (RI) than the LED chip and the functional layer. The LED chip has a textured surface to extract more of the light generated in the LED; however, the textured surface also allows reflected light back into the LED chip where it may be absorbed. The spacer layer reduces the amount of light that re-enters the LED chip, improving the overall light extraction efficiency.

It is understood that when an element such as a layer, region or substrate is referred to as being "on" another element, it can be directly on the other element or intervening elements may also be present. Furthermore, relative terms such as "inner", "outer", "upper", "above", "lower", "beneath", and "below", and similar terms, may be used herein to describe a relationship of one layer or another region. It is understood that these terms are intended to encompass different orientations of the device in addition to the orientation depicted in the figures.

Although the terms first, second, etc. may be used herein to describe various elements, components, regions, layers and/or sections, these elements, components, regions, layers and/or sections should not be limited by these terms. These terms are only used to distinguish one element, component, region, layer or section from another. Thus, a first element, component, region, layer or section discussed below could be termed a second element, component, region, layer or section without departing from the teachings of the present invention.

It is noted that the terms "layer" and "layers" are used interchangeably throughout the application. A person of ordinary skill in the art will understand that a single "layer" of material may actually comprise several individual layers of material. Likewise, several "layers" of material may be considered functionally as a single layer. In other words the term "layer" does not denote an homogenous layer of material. A single "layer" may contain various material concentrations and compositions that are localized in sub-layers. These sub-layers may be formed in a single formation step or in multiple steps. Unless specifically stated otherwise, it is not intended to limit the scope of the invention as embodied in the claims by describing an element as comprising a "layer" or "layers" of material.

Embodiments of the invention are described herein with reference to cross-sectional view illustrations that are schematic illustrations of idealized embodiments of the invention. As such, variations from the shapes of the illustrations as a result, for example, of manufacturing techniques and/or tolerances are expected. Embodiments of the invention should not be construed as limited to the particular shapes of the regions or particles illustrated herein but are to include deviations in shapes that result, for example, from manufacturing. A region illustrated or described as rectangular, for example, will typically have rounded or curved features due to normal manufacturing techniques. Thus, the regions illustrated in the figures are schematic in nature; their shapes are not intended to illustrate the precise shape of a region or particle and are not intended to limit the scope of the invention.

The term "light" as used herein is not limited to electromagnetic radiation within the visible spectrum. For convenience, "light" may also include portions of the electromagnetic spectrum outside the visible spectrum, such as the infrared or ultraviolet spectra, for example.

FIG. 1 shows a cross-sectional view an LED device 100 according to an embodiment of the present invention. An LED chip 102 is disposed on a mount surface 104. The LED chip 102 may emit light of any color, such as blue for example, or it may emit radiation outside the visible spectrum. The mount surface 104 may comprise a semiconductor material. In one embodiment, the mount surface is the original substrate on which the LED chip was grown. In another embodiment, the mount surface 104 is a carrier substrate rather than the original growth substrate. A carrier substrate might be used if the LED chip 102 was fabricated using a flip-chip technique. It is also possible to mount the LED chip 102 on many different kinds of surfaces.

The LED chip 102 has a textured light emission surface 106 included to increase light extraction from the LED chip 102 by reducing total internal reflection (TIR). There are many known techniques that may be used to modify a surface of a semiconductor material. A surface may be modified by an additive process wherein a material is added to the surface which gives it a modified texture. A surface can also be modified with subtractive processes wherein material is removed from the surface to create the modified texture. Subtractive processes, such as etching, cutting and grinding, are known in the art and frequently used to texture a surface. Opposite the textured light emission surface 106, the LED chip 102 has a reflective element 107 such as a layer of reflective material. The reflective element 107 redirects some of the light generated in the LED chip 102 back towards the textured light emission surface 106.

A spacer layer 108 is disposed on the LED chip 102. The spacer layer 108 can be made of many different materials such as silicone, epoxy, oil, dielectrics, and other materials. The material should be chosen such that the RI of the spacer layer 108 is smaller than the RI of the LED chip 102 and the RI of the functional layer 112 that is discussed below. The RI for the spacer layer 108 should be 1.4-2.0 with an acceptable RI being 1.5. The thickness of the spacer layer 108 should be approximately 1-25 microns. The thin spacer layer 108 may be deposited on the LED chip 102 using a high RPM spin-coat process, for example. The thin spacer layer 108 may also be formed by dispensing or using dielectric deposition techniques like E-beam evaporation, sputtering, magnetron sputtering, etc. The emitting surface 110 of the spacer layer is substantially planar.

At least one functional layer 112 is disposed on the spacer layer 108 such that the functional layer 112 and the LED chip 102 are physically separated. The functional layers 112 may comprise many different optical elements such as, conversion layers, filter layers, antireflective layers, single crystalline converter layers, and light scattering layers. Other types of functional layers are also possible. The functional layer 112 should have an RI that is larger than that of the spacer layer 108.

A portion of the light that is generated in the LED chip 102 passes through the layers in a forward sequence designed to improve the extraction efficiency of the device 100. The light from the LED chip 102 passes into the spacer layer 108 first. The textured surface 106 compensates for the large difference in RIs (ΔRI) of the LED chip 102 and the spacer layer 108 at their interface. In one embodiment, the LED chip comprises gallium nitride (GaN) which has an RI of approximately 2.5. The RI of the spacer layer 108 may be chosen to be 1.5. In this case, the relatively large step-down in RI ($\Delta RI \approx 1.0$) limits the amount of light that will be transmitted without significant reflection. To counter this effect the textured surface 106 provides many small surfaces from which the light may escape. However, the effect is reciprocal; any light that is reflected back toward the textured surface will likely pass into the LED chip where it may be absorbed. In order to minimize this light loss, the spacer layer 108 is chosen to have an RI that is less than the functional layer 112. A portion of the light that enters the spacer layer 108 is then incident on the boundary between the spacer layer 108 and the functional layer 112. Thus, the light sees a step-up in RI and passes into the functional layer with minimal reflection. If the light is reflected or backscattered in the functional layer 112, it will see the RI step-down at the spacer layer 108 boundary and has a finite chance of being reflected back into the functional layer 112 because of TIR. TIR at this boundary is desirable to minimize the light that re-enters the spacer layer 108 and the LED chip 102. Light that is internally reflected within the functional layer 112 has a better chance of exiting into the surrounding material, for example, an encapsulant or the ambient. In a preferred embodiment, the largest RI step ($\Delta RI$) occurs at the interface of the textured surface 106 of the LED chip 102 and the spacer layer 108.

Figure 2:
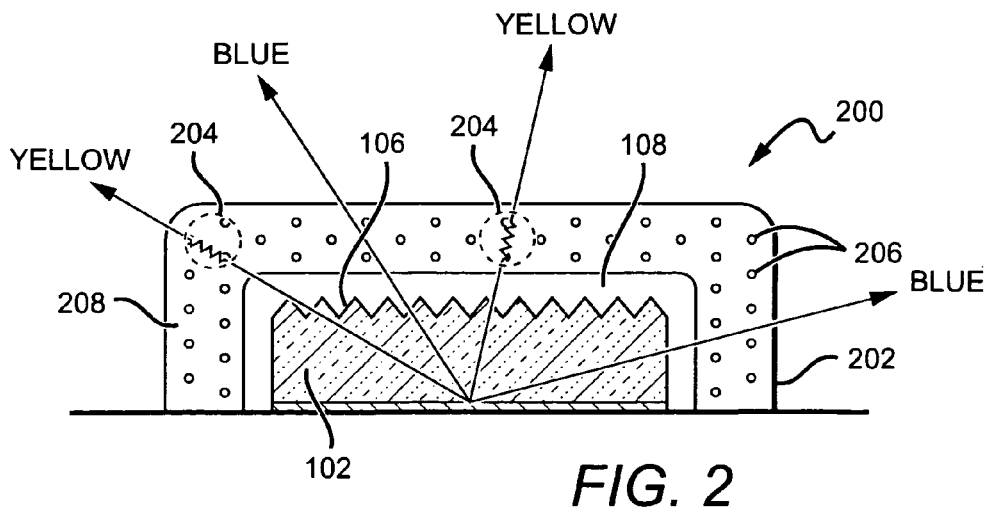
FIG. 2 is a cross-sectional view of an embodiment of an LED device according to the present invention.

In one embodiment of an LED device 200, one of the functional layers 112 comprises a wavelength conversion layer loaded with phosphors as shown in the cross-sectional view of FIG. 2. The wavelength conversion layer 202 converts a portion of the emitted light to a different wavelength, a process that is known in the art. FIG. 2 illustrates non-converted blue rays and converted yellow rays, as an example. Other colors and conversion schemes may be used. Conversion events 204 are shown occurring within the conversion layer 202. Yttrium aluminum garnet (YAG) is an example of a common phosphor that may be used.

In one embodiment, the phosphor comprises many different compositions and phosphor materials alone or in combination. In one embodiment the single crystalline phosphor can comprise yttrium aluminum garnet (YAG, with chemical formula $Y_3Al_5O_{12}$). The YAG host can be combined with other compounds to achieve the desired emission wavelength. In one embodiment where the single crystalline phosphor absorbs blue light and re-emits yellow, the single crystalline phosphor can comprise YAG:Ce. This embodiment is particularly applicable to LEDs that emit a white light combination of blue and yellow light. A full range of broad yellow spectral emission is possible using conversion particles made of phosphors based on the $(Gd,Y)_3(Al,Ga)_5O_{12}$:Ce system, which include $Y_3Al_5O_{12}$:Ce (YAG). Other yellow phosphors that can be used for white emitting LED chips include:
$Tb_{3-x}RE_xO_{12}$:Ce (TAG);
RE=Y, Gd, La, Lu; or
$Sr_{2-x-y}Ba_xCa_ySiO_4$:Eu.

In other embodiments, other compounds can be used with a YAG host for absorption and re-emission of different wavelengths of light. For example, a YAG:Nb single crystal phosphor can be provided to absorb blue light and re-emit red light. First and second phosphors can also be combined for higher CRI white (i.e., warm white) with the yellow phosphors above combined with red phosphors. Various red phosphors can be used including:
$Sr_xCa_{1-x}$S:Eu, Y; Y=halide;
$CaSiAlN_3$:Eu; or
$Sr_{2-y}Ca_ySiO_4$:Eu.

Other phosphors can be used to create saturated color emission by converting substantially all light to a particular color. For example, the following phosphors can be used to generate green saturated light:
$SrGa_2S_4$:Eu;
$Sr_{2-y}Ba_ySiO_4$:Eu; or
$SrSi_2O_2N_2$:Eu.

The following lists some additional suitable phosphors that can be used as conversion particles, although others can be used. Each exhibits excitation in the blue and/or UV emission spectrum, provides a desirable peak emission, has efficient light conversion, and has acceptable Stokes shift:
Yellow/Green
$(Sr,Ca,Ba) (Al,Ga)_2S_4$:$Eu^{2+}$
$Ba_2 (Mg,Zn) Si_2O_7$:$Eu^{2+}$
$Gd_{0.46}Sr_{0.31}Al_{1.23}O_xF_{1.38}$:$Eu^{2+}_{0.06}$
$(Ba_{1-x-y}Sr_xCa_y)SiO_4$:Eu
$Ba_2SiO_4$:$Eu^{2+}$
Red
$Lu_2O_3$:$Eu^{3+}$
$(Sr_{2-x}La_x)(Ce_{1-x}Eu_x)O_4$
$Sr_2Ce_{1-x}Eu_xO_4$
$Sr_{2-x}Eu_xCeO_4$
$SrTiO_3$:$Pr^{3+}$,$Ga^{3+}$
$CaAlSiN_3$:$Eu^{2+}$
$Sr_2Si_5N_8$:$Eu^{2+}$ The phosphor particles 206 are dispersed throughout a binder material 208. The RI of the phosphor particles 206 and the RI of the binder 208 can be the same, or they can be different. However, the difference is usually minimized to reduce scattering.

Table 1 shows light extraction efficiencies (LEE in %) for devices with and without spacer layers for different refractive index combinations for the spacer and the binder. The reflectivity of the mirror inside the chip is assumed constant and the RI of the phosphor is assumed to be 1.8.

TABLE 1

| Binder RI | Spacer RI | LEE w/o spacer | LEE w spacer |
|---|---|---|---|
| 1.6 | 1.6 | 76 | 76.2 |
| 1.8 | 1.4 | 74.2 | 74.3 |
| 1.8 | 1.5 | 74.2 | 76.8 |
| 1.8 | 1.6 | 74.2 | 76.2 |
| 1.9 | 1.6 | 74.3 | 74.4 |

The data in Table 1 indicates an increase in light extraction efficiency for all the devices having a spacer layer. The highest LEE occurs in the device having a spacer layer with a binder RI$\approx$1.8 and a spacer layer RI$\approx$1.5.

Another advantage of this embodiment is the non-adjacent arrangement of the conversion layer 202 and the LED chip 102. This is sometimes referred to as a "remote phosphor" approach. Because thermal quenching can affect the efficiency of the phosphor, it is important to control the heat that is transferred into the conversion layer 202. FIG. 2 shows the spacer layer 108 physically separating the conversion layer 202 from the LED chip 102. This configuration reduces the amount of heat that is transferred from the LED chip 102 to the conversion layer 202. Thus, the spacer layer 108 can function as a thermal buffer that improves the efficiency and the lifetime of the conversion layer 202.

Figure 3:
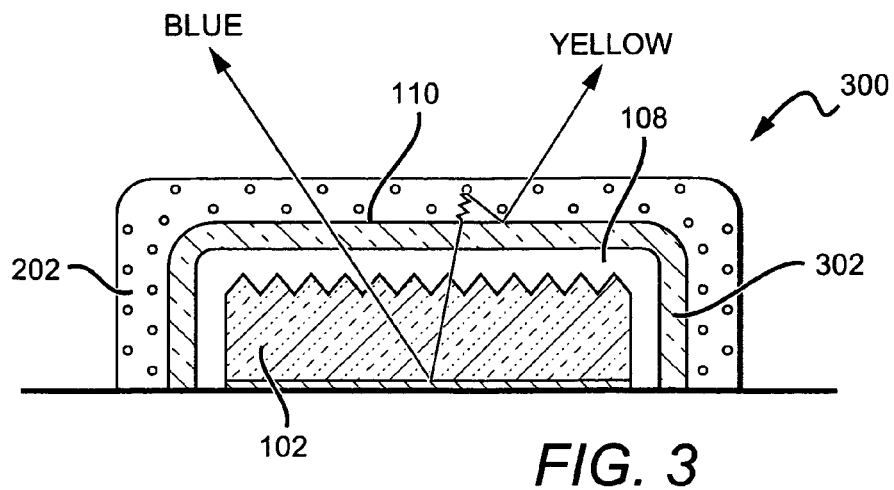
FIG. 3 is a cross-sectional view of an embodiment of an LED device according to the present invention.

FIG. 3 shows cross-sectional view of another embodiment of an LED device 300. In this embodiment, the functional layer comprises a filter layer 302 that is transmissive to light within a desired range of wavelengths. The filter layer 302 is disposed on the substantially planar surface 110 of the spacer layer 108. The filter layer 302 may have the characteristics of a low-pass filter, a high-pass filter, a band-pass filter, a notch filter, or other types of filters. For example, the filter layer 302 may be designed to be transmissive to light in the blue range and reflective to light in the yellow range (e.g., a high-pass filter). Such a filter may be useful in conjunction with a wavelength conversion layer. As shown in FIG. 3, assuming an embodiment in which the LED chip 102 emits in the blue range, the filter layer transmits the blue light into the conversion layer 202. A portion of the blue light emitted from the LED chip 102 is downconverted in the conversion layer 202 to yellow light. Some of the yellow light may be redirected back toward the filter layer 302 which is not transmissive to yellow light. The incident yellow light is reflected back toward the emission surface. Thus, the filter layer 302 prevents a substantial portion of the converted light from re-entering the spacer layer 202 and the LED chip 102 where it may be absorbed.

Figure 4:
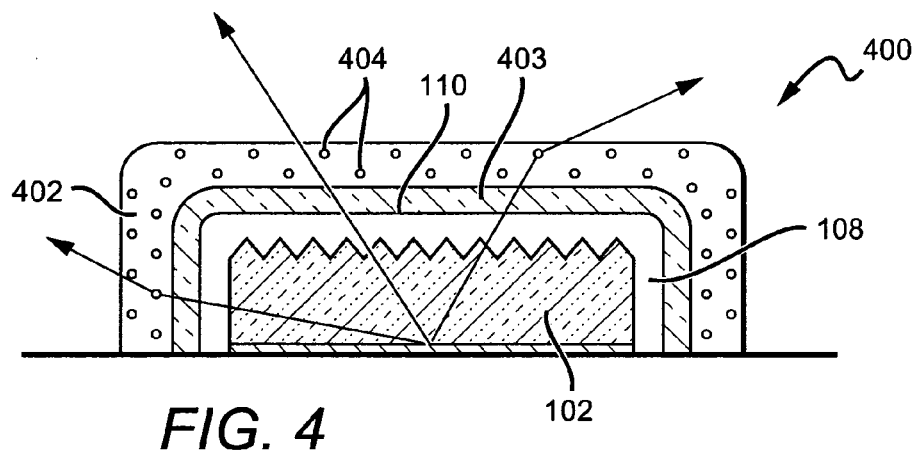
FIG. 4 is a cross-sectional view of an embodiment of an LED device according to the present invention.

FIG. 4 shows a cross-sectional view of another embodiment of an LED device 400. In this particular embodiment, the functional layers comprise a light scattering layer 402 which is disposed on a wavelength conversion layer 403. The two functional layers are disposed on the spacer layer 108. The light scattering layer 402 may include light scattering particles 404 dispersed throughout a medium such as silicone or epoxy, for example. Light scattering layers may be used to improve the color temperature distribution uniformity of the output profile by scattering the light rays before they exit the LED package. The scattering disassociates the light rays from the original angle at which they were emitted from the LED chip 102, eliminating noticeable color patterns in the light output. The light scattering layer 402 and the wavelength conversion layer 403 are separated from the LED chip 102 by the spacer layer 108. The RI of the spacer layer 108 is less than the RI of the conversion layer 403 and the light scattering layer 402 to improve light extraction as discussed above.

Another advantage of this particular embodiment is the non-adjacent arrangement of the functional layers 402, 403 and the LED chip 102. As light enters the light functional layers 402, 403 some of the light will be backscattered toward the spacer layer 108. Because the spacer layer 108 has an RI that is smaller than the light wavelength conversion layer 403, a substantial portion of the light will be reflected at the interface between the wavelength conversion layer 403 and the spacer layer 108, back into the wavelength conversion layer 403 and has a better chance of being emitted. The substantially planar surface 110 of the spacer layer 108 enhances the desired TIR effect at the boundary.

Figure 5:
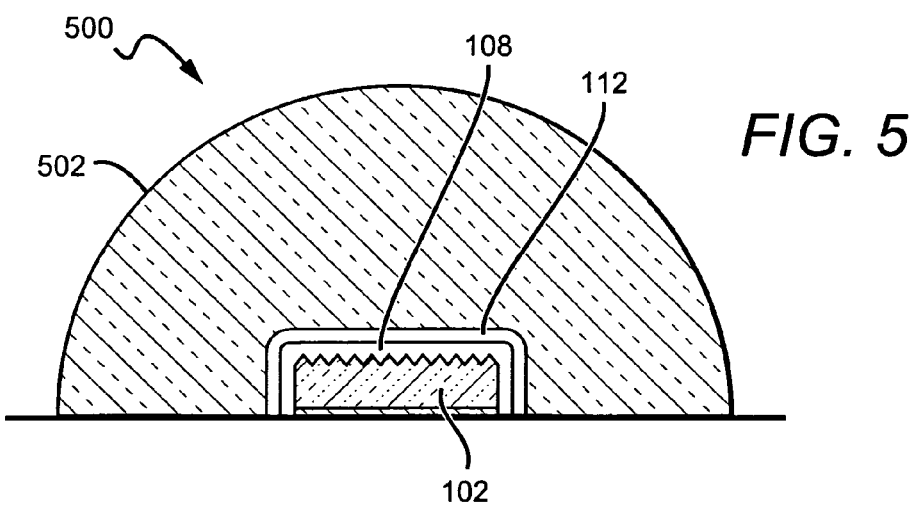
FIG. 5 is a cross-sectional view of an embodiment of an LED device according to the present invention.

FIG. 5 illustrates another embodiment of an LED device 500. In this particular embodiment, an overmolded encapsulant 502 is disposed over the LED chip 102, the spacer layer 108 and the functional layer 112. Encapsulants, often used to improve package light extraction efficiency and protect the LED and the conformal layers, are known in the art and may be made from several materials such as silicone (RI≈1.5), for example. The encapsulant 502 may also function as beam-shaping element, such as a lens. The encapsulant 502 is hemispherical, although other shapes are possible.

Although various embodiments of the present invention have been discussed, other embodiments featuring different combinations of elements are also possible without departing from the spirit of the invention as claimed. For example, a filter layer 302 as shown in FIG. 3 may be included in an embodiment that also comprises a reflective element light scattering layer 402 as shown in FIG. 4. Therefore, the spirit and scope of the invention should not be limited to any particular combination of elements in the versions described above.

I claim:

1. A light emitting diode (LED) device, comprising:
   an LED chip on a mount surface, said LED chip comprising sidewalls and a textured light emission surface, said LED chip having a first index of refraction;
   a reflective element opposite said textured light emission surface such that said reflective element is between said LED chip and said mount surface;
   a spacer layer disposed on said LED chip and covering said light emission surface and said sidewalls, said spacer layer having a second index of refraction that is smaller than said first index of refraction; and
   at least one functional layer comprising a wavelength conversion layer disposed on said spacer layer, said wavelength conversion layer comprising a binder material embedded with a plurality of phosphor particles, said phosphor particles having a third index of refraction that is larger than said second index of refraction, wherein said binder material has a substantially similar index of refraction to said phosphor particles;
   wherein said spacer layer and said functional layer are conformal to said LED chip.

2. The LED device of claim 1, wherein said second index of refraction is approximately 1.5 and said third index of refraction is approximately 1.8.

3. The LED device of claim 1, said wavelength conversion layer comprising a single crystalline phosphor material.

4. The LED device of claim 1, said wavelength conversion layer comprising a nano-crystalline phosphor dispersed throughout a binder material.

5. The LED device of claim 1, said at least one functional layer further comprising a filter layer that is transmissive to light of a first range of wavelengths and reflective to light of a second range of wavelengths, wherein said filter layer is interposed between said spacer layer and said wavelength conversion layer.

6. The LED device of claim 1, wherein said LED chip is configured to emit blue light and said wavelength conversion layer is configured to convert a portion of said blue light into yellow light such that said LED device emits said blue and yellow light in a combination that appears white.

7. The LED device of claim 1, wherein said at least one functional layer comprises a light scattering element.

8. The LED device of claim 7, wherein said light scattering element comprises light scattering particles.

9. The LED device of claim 1, wherein said spacer layer comprises a substantially planar surface opposite said LED chip.

10. The LED device of claim 1, wherein said functional layer comprises an anti-reflective coating layer.

11. The LED device of claim 1, wherein said spacer layer has a thickness of approximately 1-25 micrometers.

12. The LED device of claim 1, further comprising a hemispherical encapsulant disposed on said mount surface and covering said LED chip.

13. The LED device of claim 12, said encapsulant having an index of refraction of approximately 1.5.

14. The LED device of claim 1, wherein said LED chip comprises aluminum gallium indium nitride (AlGaInN) semiconductor layers.

15. The LED device of claim 1, wherein said spacer layer thermally insulates said functional layer from said LED chip.

16. The LED device of claim 1, wherein said spacer layer passivates said LED chip.

17. A light emitting diode (LED) device, comprising:
- an LED chip on a mount surface, said LED chip comprising sidewalls and a textured light emission surface, said LED chip having a first index of refraction and emitting blue light;
- a reflective element opposite said textured light emission surface such that said reflective element is between said LED chip and said mount surface;
- a spacer layer disposed on said LED chip and covering said light emission surface and said sidewalls, said spacer layer comprising a planar surface opposite said LED chip and a second index of refraction that is smaller than said first index of refraction;
- a wavelength conversion layer disposed on a light emission surface and sidewalls of said spacer layer, said wavelength conversion layer comprising a binder material embedded with a plurality of phosphor particles, said wavelength conversion layer converting a portion of said blue light and emitting yellow light, said phosphor particles having a third index of refraction that is larger than said second index of refraction, wherein said binder material has a substantially similar index of refraction to said phosphor particles; and
- an encapsulant disposed on said mount surface and covering said LED chip;
- wherein said spacer layer and said wavelength conversion layer are conformal to said LED chip;
- wherein said light emitting diode (LED) device is constructed to emit a combination of said blue and yellow light such that said combination appears white.

18. The LED device of claim 17, further comprising a filter layer that is transmissive to light of a first range of wavelengths and reflective to light of a second range of wavelengths, wherein said filter layer is interposed between said spacer layer and said wavelength conversion layer.

19. The LED device of claim 17, wherein said third index of refraction is approximately 1.8.

20. The LED device of claim 17, wherein said first index of refraction is approximately 2.5.

21. The LED device of claim 17, wherein said second index of refraction is approximately 1.5.

22. The LED device of claim 17, wherein said spacer layer has a thickness of approximately 1-25 micrometers.

23. The LED device of claim 17, said wavelength conversion layer comprising light scattering particles.

24. The LED device of claim 17, said encapsulant comprising light scattering particles.

25. The LED device of claim 17, wherein said LED chip comprises aluminum gallium indium nitride (AlGaInN) semiconductor layers.

26. The LED device of claim 17, wherein said spacer layer thermally insulates said wavelength conversion layer from said LED chip.

27. A method of fabricating a light emitting diode (LED) device, comprising:
- providing an LED chip having a first index of refraction, said LED chip comprising sidewalls and a textured light emission surface;
- disposing a reflective element opposite said textured light emission surface such that said reflective element is between said LED chip and a mount surface;
- disposing a spacer layer, conformal to said LED chip, with a second index of refraction on said LED chip, wherein said second index of refraction is smaller than said first index of refraction;
- disposing a functional layer comprising a wavelength conversion layer on said spacer layer and conformal to said LED chip, said wavelength conversion layer comprising a binder material and a plurality of phosphor particles, said phosphor particles having a third index of refraction, wherein said second index of refraction is smaller than said third index of refraction, and said second index of refraction is chosen to maximize light extraction efficiency, wherein said binder material has a substantially similar index of refraction to said phosphor particles.

28. The method of claim 27, further comprising dispersing light scattering particles throughout said functional layer.

29. The method of claim 27, further comprising encapsulating said LED chip with an encapsulant.

30. The method of claim 29, further comprising dispersing light scattering particles throughout said encapsulant.

31. The method of claim 27, wherein said spacer layer has a thickness of approximately 1-25 micrometers.

32. The method of claim 27, wherein said second index of refraction is approximately 1.5 and said third index of refraction is approximately 1.8.

33. The method of claim 27, wherein said LED chip comprises aluminum gallium indium nitride (AlGaInN) semiconductor layers.

34. The LED device of claim 12, wherein said encapsulant has an index of refraction equal to said third index of refraction.

35. The LED device of claim 12, wherein said encapsulant has an index of refraction less than that of said third index of refraction.

36. The LED device of claim 1, wherein a carrier substrate comprises said mount surface.

37. The LED device of claim 17, wherein a carrier substrate comprises said mount surface.

38. The method of claim 27, wherein a carrier substrate comprises said mount surface.

* * * * *